United States Patent [19]
Mahler et al.

[11] Patent Number: 5,133,285
[45] Date of Patent: Jul. 28, 1992

[54] APPARATUS FOR TRANSPORTING SUBSTRATES

[75] Inventors: Peter Mahler, Hainburg; Herbert Naehring, Rodenbach, both of Fed. Rep. of Germany

[73] Assignee: Leybold Aktiengesellschaft, Hanau, Fed. Rep. of Germany

[21] Appl. No.: 643,622

[22] Filed: Jan. 16, 1991

[30] Foreign Application Priority Data

Nov. 15, 1990 [DE] Fed. Rep. of Germany ....... 4036339

[51] Int. Cl.$^5$ .............................................. C23C 16/00
[52] U.S. Cl. .................................... 118/719; 118/715; 118/725; 118/729; 414/217
[58] Field of Search ............... 118/715, 719, 725, 729; 414/217

[56] References Cited

U.S. PATENT DOCUMENTS 4,042,128  8/1977  Shrader ............................... 118/719

FOREIGN PATENT DOCUMENTS 0346815  12/1989  European Pat. Off. .
8027173   2/1981  Fed. Rep. of Germany .
3941502   6/1990  Fed. Rep. of Germany .

Primary Examiner—Richard Bueker
Attorney, Agent, or Firm—Felfe & Lynch

[57] ABSTRACT

Apparatus for transporting substrates 22, 23 in vacuum deposition systems with several stations, comprising plate-like substrate holders 16 which are moved across the stations in a vertical position along a given path and have two rails which interact with two rows of rollers provided underneath the substrate holders. The side of the first rail 13 facing away from the substrate holder 16 has a longitudinal groove 13a which interacts with rollers 7, 7', 7", ... which are rotatably disposed at the frame 4 of the apparatus and disposed in a first row where they are spaced apart. The second rail 14 runs parallel to the first one and has a planar bearing surface 14a the plane $E_2$ of which intersects the rotating axes $V_a$ of the first row at a right angle and approximately traverses the center of gravity S of the substrate holder 16. The bearing surface 14a interacts with S rollers 8, 8', ... which are disposed in a second row and at the bottom of the frame 4 where they rotate around vertical axes $1_a$. A vertical plane $E_1$ in the longitudinal groove 13a of the first rail 13 is laterally offset with respect to plane $E_2$ of the planar bearing surface.

4 Claims, 1 Drawing Sheet

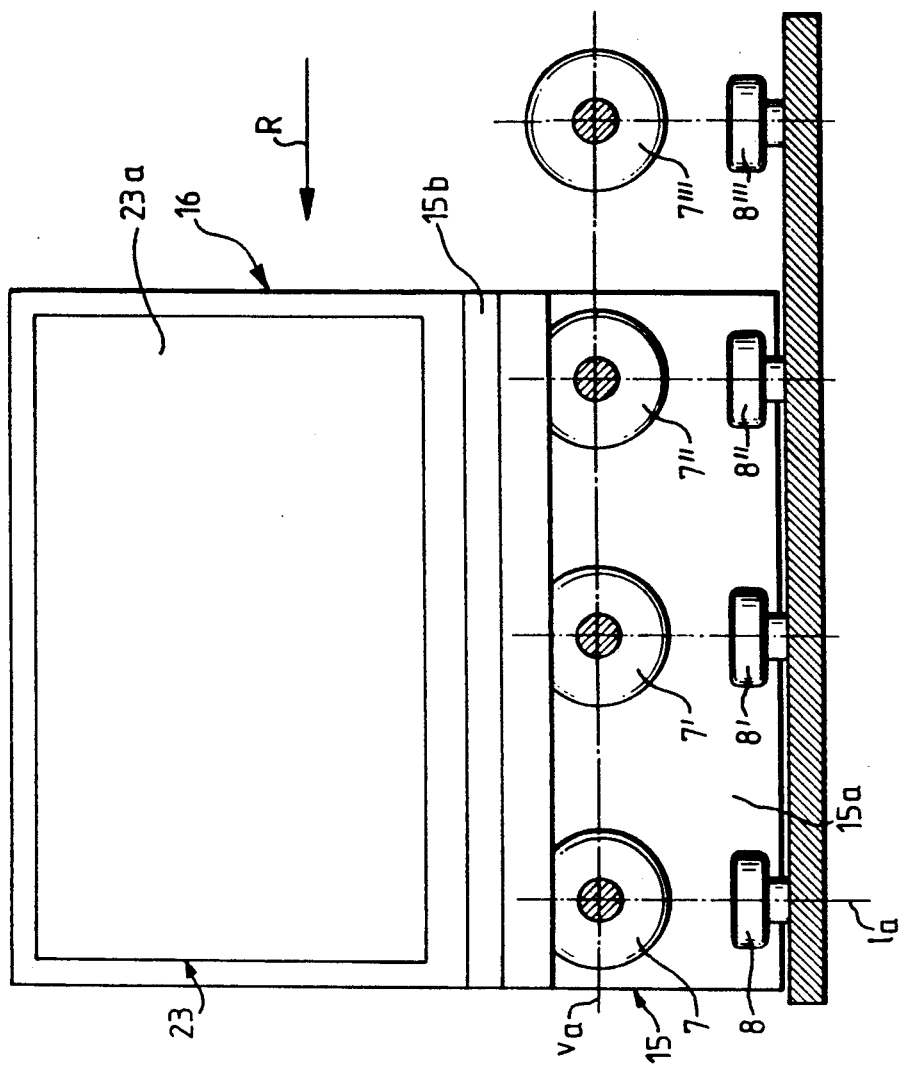
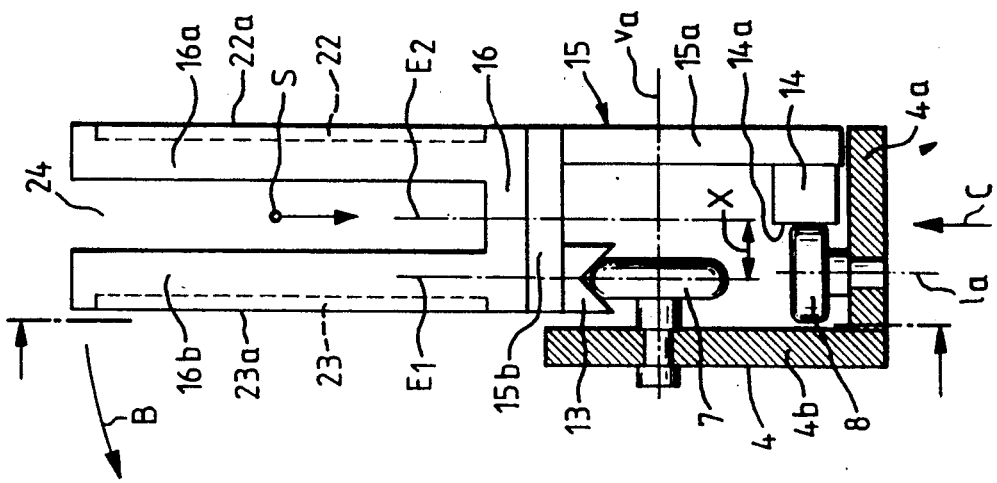

APPARATUS FOR TRANSPORTING SUBSTRATES

BACKGROUND OF THE INVENTION

The invention concerns an apparatus for transporting substrates in vacuum deposition systems with several stations, comprising substrate holders of an approximately plate-like, flat, parallelpiped configuration. These substrate holders, in a vertical position, can be moved across the stations following a given path. They interact with rails provided underneath the substrates which in turn are fastened to the substrate holders. For this purpose, the foot part of the substrate holder has at least two parallel spaced apart rails.

The substrate holders used here are either plates having recesses formed to match the shape of the substrate or they have a frame with bars to which the substrates are fastened. Generally, one substrate holder can hold a plurality of substrates.

U.S. Pat. No. 4,042,128 discloses a transporting apparatus of the aforesaid kind where the plate-like substrates are guided in both their upper and lower longitudinal edges between rollers which can be rotated around perpendicular axes. The main axis of the substrate holder remains in a vertical position. The lower edges of the substrate holder rest in addition on support rollers with a horizontal rotating axis. The lower guide rollers alone, however, are not able to keep the substrate in an exact vertical position and transport it such that a stable positioning is possible with the exclusive aide of the upper guide rollers.

Also known is a transporting apparatus for vacuum deposition systems (EP 254 145 B1, to which U.S. Pat. No. 4,765,273 corresponds) which has several stations and includes a roller system to guide and advance essentially two-dimensional substrate holders across the stations in a perpendicular position along a given path. Pairs of guiding rollers which can be rotated around perpendicular axes are disposed in the area of the lower edge of the substrate holder and hold the latter between their rollers. The substrate holders are guided by these roller systems exclusively in the area of their lower edge. The guide rollers have bearing surfaces which are disposed at the lower and upper ends, respectively, of at least one guide roller of each pair of rollers. The respective other guide roller of the same pair has at least one bearing surface and the at least three bearing surfaces of each pair of rollers act as a tilt-safe bracing with respect to the substrate holder.

This known transporting apparatus was based on the task of preventing to a largest possible extent coating material which trickles down from interfering with the coating process.

Further, it also been proposed to provide the substrate holder of a transporting apparatus of a vacuum deposition system with a foot part moving in stationary rails (EP 0 346 815).

Finally, a DE-A 40 29 905.8, to which U.S. application Ser. No. 616,342 corresponds, describes a system for transporting substrates in vacuum deposition systems with several stations by providing rails that are disposed in the area of the foot part of a substrate holder.

For this purpose, each foot part is provided with a pair of vertically disposed, parallel spaced apart rails where the opposing narrow sides have longitudinal grooves that communicate with rollers or slide rails. The latter are disposed on the bottom of the device in a stationary manner and run in rows corresponding to the course of the grooves and are spaced apart in vertical planes on top of one another. The substrate holder has shaft-like recess extending from the top into the area of the foot part and running parallel to the rails. When passing through the stations, a flat, vertically extending heater, which is disposed above the substrate holder at the upper part of the wall, extends into this recess.

SUMMARY OF THE INVENTION

The present invention addresses in particular the task of providing substrate holders for several substrates and to configure the substrate holders such that all the substrates that pass through a processing station can be treated at the same time. Especially during transport, the substrate should be held and guided absolutely free of interferences and with a minimum of lateral movements (shaking). Further, they should be configured such that the substrate carriers can be rapidly withdrawn and removed from the apparatus without the use of tools.

The invention accomplishes this object in that the narrow side of the first rail which faces away from the substrate holder has a longitudinal groove which interacts with rollers. These rollers are rotatably disposed at the frame of the apparatus, and they are spaced apart in one row following the course of the groove. The second rail runs parallel to the first one and has a planar bearing surface. The plane thereof intersects the axes of rotation of the rollers associated with the first rail at a right angle and traverses the center of gravity of the substrate holder. Further it interacts with the rollers which are disposed in one row at the bottom of the frame where they can be rotated around a vertical axis. With respect to the plane, the longitudinal axes of the groove of the first rail is laterally offset by a certain value.

BRIEF DESCRIPTION OF THE DRAWINGS

FIG. 1 is an end section of the transport apparatus.
FIG. 2 is a side section of the transport apparatus.

DETAILED DESCRIPTION OF THE PREFERRED EMBODIMENT

As seen in the drawing, the apparatus essentially comprises a coating chamber (not represented in further detail), rollers 7, 7', . . . 8, 8', . . . rotatably disposed at horizontally and vertically extending bars 4a, 4b of an L-shaped frame 4. It further includes a foot part 15 of a substrate holder 16 having a U-like cross section, this foot part having rails 13, 14, and further the two frame-like side parts 16a, 16b of a substrate holder 16 which hold the substrates 22, 23.

When the coating station which is not represented in greater detail is in operation, the substrates 22, 23 pass the cathodes of the coating station vertically to the plane of drawing in direction R.

Once the outer surfaces 22a, 23a of the substrates 22, 23 are coated, they are advanced in the same direction R (vertically to the plane of drawing) until they reach the next processing station. The discoidal substrates 22, 23 are held by the side parts 16a, 16b of the substrate holder 16 which surround them in a frame-like manner. The substrate holder 16 in turn is firmly connected to the upper bar 15b of the foot part 15 and configured as one piece therewith. The foot part 15 is mounted to a pair of rails 13, 14 in screwed or welded connection.

First rail 13 has a longitudinal groove 13a to accommodate the rollers 7, 7', . . . These rollers are spaced successively apart and disposed at the vertical bar 4b of the frame 4 where they can be rotated around the axes $V_8$. The space between the rows of rollers 7, 8 and/or the arrangement of both rails 13, 14 is selected such that the foot part 15 is held and guided thereon in a tilt-safe manner.

The substrate holder 16 having a slot or shaft like recess 24 with its cross-sectionally approximately L-shaped foot part connected to it has a center of gravity S. The location thereof in turn is selected such that the vertically extending plane $E_2$ determined by the bearing surface 14a of the second rail 14 approximately intersects this center of gravity S or is located to the right thereof whereas another also vertically extending plane $E_1$ which traverses groove 13a of the first rail runs at a certain distance X from the plane $E_2$ which intersects the center of gravity S.

The smooth and stable passage of the substrate holder 16 along the frame 4 with its torsion-resistant, L-shaped cross sectional profile is co-determined by the value X, i.e. from the distance between the center plane of the groove 13a of the first rail 13 and the moving plane 14a of the second rail.

As seen in the drawing, the foot part 15 too has an L-shaped cross sectional profile with the length of bar 15a approximately corresponding to the length of bar 4b of frame 4 and the length of bar 15b approximately to the width of bottom 4a of the frame.

A particular advantage of the invention resides in that the substrate carrier 16 can be tilted to the side in direction of arrow B around the bearing surfaces of the upper rollers 7, 7', . . . without problems and, at the same time, it can be removed toward the top, i.e. in direction of arrow C.

We claim:

1. Apparatus for transporting substrates along a path past several stations in a vacuum deposition system, comprising
   a substrate holder having a first rail with a downward facing groove defining a vertical groove plane $E_1$ therethrough and a second rail having a planar bearing surface defining a vertical plane $E_2$ therethrough which is parallel to and offset from said plane $E_1$, said holder having a center of gravity lying in a vertical plane S which is parallel to said planes E1 and $E_2$, and
   a frame having a first row of rollers having horizontal axes and riding in said downward facing groove of said first rail, and a parallel second row of rollers having vertical axes and riding against said planar bearing surface of said second rail.

2. Apparatus as in claim 1 wherein said frame comprises
   a vertically extending upper bar to which the first row of rollers are mounted, and
   a horizontally extending lower bar to which the second row of rollers are mounted.

3. Apparatus as in claim 1 wherein the distance between the plane $E_2$ and the plane $E_1$ is greater than or equal to the distance between the plane S and the plane $E_1$.

4. Apparatus as in claim 1 wherein said substrate holder comprises
   two substantially planar, parallel, frame-like side parts having apertures in which said substrates are inserted, and
   a foot part from which said side parts extend upward, said rails being fixed to said foot part.

* * * * *